United States Patent
Seok et al.

(10) Patent No.: US 12,112,469 B2
(45) Date of Patent: Oct. 8, 2024

(54) AUTOMATIC DISPLAY PIXEL INSPECTION SYSTEM AND METHOD

(71) Applicant: LG ELECTRONICS INC., Seoul (KR)

(72) Inventors: Seunghwan Seok, Seoul (KR); Hyohyung Lee, Seoul (KR); Inbum Yang, Seoul (KR); Bongwoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 320 days.

(21) Appl. No.: 17/597,433

(22) PCT Filed: Jul. 9, 2019

(86) PCT No.: PCT/KR2019/008450
§ 371 (c)(1),
(2) Date: Jan. 5, 2022

(87) PCT Pub. No.: WO2021/006379
PCT Pub. Date: Jan. 14, 2021

(65) Prior Publication Data
US 2022/0284559 A1    Sep. 8, 2022

(30) Foreign Application Priority Data

Jul. 9, 2019 (KR) .................. 10-2019-0082790

(51) Int. Cl.
*G06T 7/00* (2017.01)
*G01N 21/95* (2006.01)
(Continued)

(52) U.S. Cl.
CPC ............ *G06T 7/001* (2013.01); *G01N 21/95* (2013.01); *H01L 27/156* (2013.01);
(Continued)

(58) Field of Classification Search
CPC .......... G06T 7/001; G06T 2207/10024; G06T 2207/10152; G06T 2207/20221;
(Continued)

(56) References Cited

U.S. PATENT DOCUMENTS

2010/0045690 A1* 2/2010 Handschy ............ G09G 3/3629
345/545
2014/0233797 A1 8/2014 Hodder et al.
(Continued)

FOREIGN PATENT DOCUMENTS

| JP | 2016170036 | 9/2016 |
| KR | 1020150005628 | 1/2015 |
| KR | 1020180089771 | 8/2018 |

OTHER PUBLICATIONS

PCT International Application No. PCT/KR2019/008450, International Search Report dated Apr. 7, 2020, 16 pages.

*Primary Examiner* — Alazar Tilahun
(74) *Attorney, Agent, or Firm* — LEE, HONG, DEGERMAN, KANG & WAIMEY

(57) ABSTRACT

The present invention relates to an automatic display pixel inspection system and method and, particularly, to an automatic inspection system and method for inspecting defects occurring in the process of assembling semiconductor light emitting devices in a fluid.

11 Claims, 11 Drawing Sheets

(51) Int. Cl.
*H01L 27/15* (2006.01)
*H01L 33/00* (2010.01)
*H01L 33/44* (2010.01)

(52) U.S. Cl.
CPC ............ *H01L 33/005* (2013.01); *H01L 33/44* (2013.01); *G01N 2201/062* (2013.01); *G01N 2201/0633* (2013.01); *G06T 2207/10024* (2013.01); *G06T 2207/10152* (2013.01); *G06T 2207/20221* (2013.01); *G06T 2207/30148* (2013.01); *G06T 2207/30168* (2013.01)

(58) Field of Classification Search
CPC . G06T 2207/30148; G06T 2207/30168; G06T 3/40; G06T 7/0004; G01N 21/95; G01N 2201/062; G01N 2201/0633; G01N 21/8851; G01N 2021/8887; G01N 2021/9513; H01L 27/156; H01L 33/005; H01L 33/44; H01L 2224/95101; H01L 21/67242; G09G 2300/0426; G09G 2380/02; G09G 3/035; G09G 3/3208; G09G 5/026; G09G 5/022; G09G 3/006
See application file for complete search history.

(56) References Cited

U.S. PATENT DOCUMENTS

| | | | |
|---|---|---|---|
| 2016/0182821 A1* | 6/2016 | Shabtay | H04N 25/133 348/239 |
| 2017/0140961 A1* | 5/2017 | Sasaki | H01L 33/62 |
| 2020/0050007 A1* | 2/2020 | Kim | G01J 3/14 |

* cited by examiner (a)

(b)

(a)　　　　　　　　　　　　　　(b)

AUTOMATIC DISPLAY PIXEL INSPECTION SYSTEM AND METHOD

CROSS-REFERENCE TO RELATED APPLICATIONS

This application is the National Stage filing under 35 U.S.C. 371 of International Application No. PCT/KR2019/008450, filed on Jul. 9, 2019, which claims the benefit of earlier filing date and right of priority to Korean Patent Application No. 10-2019-0082790, filed on Jul. 9, 2019, the contents of which are all incorporated by reference herein in their entirety.

TECHNICAL FIELD

The present disclosure relates to automatic display pixel inspection system and method, and particularly, to automatic inspection system and method for inspecting an assembly defect of a semiconductor light emitting device in a fluid.

BACKGROUND ART

Recently, in the field of display technology, a display device having excellent characteristics in terms of thinness and flexibility has been developed. On the other hand, currently commercialized major displays are represented by a liquid crystal display (LCD) and organic light emitting diodes (OLED).

However, in the case of the LCD, the response time is not sufficiently short and it is difficult to implement a flexible display. In the case of the OLED, the lifespan of the OLED is short and the mass production yield thereof is not good.

A light emitting diode (LED) is a light emitting semiconductor device that is well known for converting electric current into light. Red LEDs using GaAsP compound semiconductors began to be commercialized in 1962, and have been used as light sources along with GaP:N-based green LEDs for image display on electronic devices including information and communication devices. Accordingly, one solution to the above-described issues may be to implement a display using the light emitting semiconductor device. The light emitting semiconductor device has various advantages, such as a long lifespan, low power consumption, excellent characteristics related to initial driving, and high resistance against vibration, compared to a filament-based light emitting device.

In one example, in a case of a display using a semiconductor light emitting device, because the semiconductor light emitting device corresponding to each pixel must be coupled to a substrate, implementation of a large-screen, high-pixel display may be relatively difficult. Accordingly, recently, a self-assembly scheme in which the semiconductor light emitting devices injected into a fluid are moved to the substrate using an electromagnetic field and then assembled has been developed.

An automatic visual inspection system may be used to inspect an assembly defect of the semiconductor light emitting devices in such a self-assembly scheme in the fluid.

However, an existing automatic visual inspection system had a problem in that a degree of definition of an acquired inspection image is low due to chromatic aberration caused by a refractive index of the fluid.

In addition, a method for correcting the chromatic aberration through a separate chromatic aberration-removing lens or automatic control had disadvantages in that design is complicated and cost is high.

Furthermore, the existing automatic visual inspection system had a disadvantage of being difficult to be changed flexibly based on design of the display.

Accordingly, there is a demand for an automatic visual inspection system and a method for the controlling the same for rapidly and precisely inspecting the assembly defect of the semiconductor light emitting device in the fluid.

DISCLOSURE

Technical Problem

One embodiment of the present disclosure aims to provide automatic display pixel inspection system and method capable of obtaining a clear inspection image by minimizing chromatic aberration using monochromatic light.

Another embodiment of the present disclosure aims to provide automatic display pixel inspection system and method capable of efficiently correcting chromatic aberration at low cost by automatically controlling a distance between an inspection object and a lens based on a wavelength of monochromatic light.

Another embodiment of the present disclosure aims to provide automatic display pixel inspection system and method that may be flexibly applied to various inspection environments.

Technical Solutions

In an automatic display pixel inspection system according to an embodiment of the present disclosure, an inspection system for detecting an assembly defect of a semiconductor light emitting device self-assembled onto a substrate in a fluid includes a fluid tank including an outer wall made of a transparent material allowing inspection of an inspection object within the fluid from the outside, lighting for irradiating a red, green, or blue monochromatic light beam to the inspection object in a predetermined order, a telecentric lens for condensing light reflected from the inspection object irradiated with the monochromatic light beam from the outside of the fluid tank, a driver capable of moving the telecentric lens in an optical axis direction of the telecentric lens, a controller that controls the driver to adjust a distance between the inspection object and the telecentric lens in response to a wavelength of the monochromatic light beam, and a camera for receiving the reflected light that has passed through the telecentric lens to acquire a plurality of inspection images of a certain size corresponding to the red, green, and blue monochromatic light beams, respectively, and the controller detects the assembly defect of the semiconductor light emitting device by synthesizing the plurality of inspection images into a color image of three channels.

In an automatic display pixel inspection method according to an embodiment of the present disclosure, an inspection method for detecting an assembly defect of a semiconductor light emitting device self-assembled onto a substrate in a fluid includes loading an inspection object into a fluid tank, moving a telecentric lens to an inspection position outside the fluid tank, irradiating red, green, and blue monochromatic light beams to the inspection object in a predetermined order to obtain a plurality of inspection images of a certain size respectively corresponding to the red, green, and blue monochromatic light beams, synthesizing the plurality of inspection images into a color image of three channels, and detecting the assembly defect of the semiconductor light emitting device by analyzing the color image of the three channels.

Advantageous Effects

According to one embodiment of the present disclosure, the clear inspection image may be obtained by minimizing the chromatic aberration using the monochromatic light.

According to another embodiment of the present disclosure, the chromatic aberration may be efficiently corrected at the low cost by automatically controlling the distance between the inspection object and the lens based on the wavelength of the monochromatic light.

According to another embodiment of the present disclosure, the present disclosure may be flexibly applied to the various inspection environments.

BEST MODE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the light emitting semiconductor device mentioned in this specification is a concept including an LED, a micro LED, and the like, and may be used interchangeably therewith.

Figure 1:
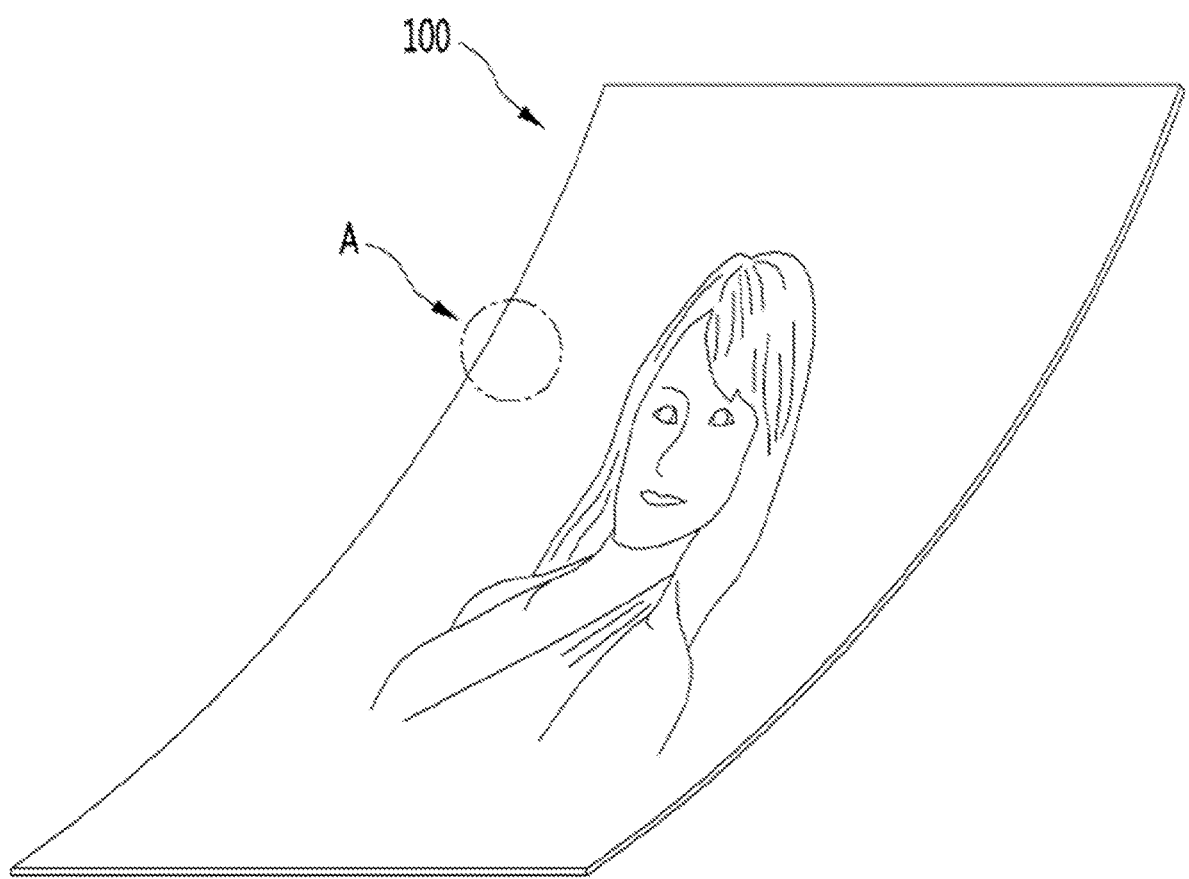
FIG. 1 is a diagram illustrating an inspection object of automatic display pixel inspection system and method according to an embodiment of the present disclosure.

FIG. 1 is a diagram illustrating an inspection object of automatic display pixel inspection system and method according to an embodiment of the present disclosure. In this connection, the inspection object may be a substrate and a semiconductor light emitting device constituting a display device 100.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a light emitting semiconductor device. In the present disclosure, a light emitting diode (LED) is exemplified as a type of the light emitting semiconductor device configured to convert electric current into light. The LED may be formed in a small size, and may thus serve as a unit pixel even in the second state.

Figure 2:
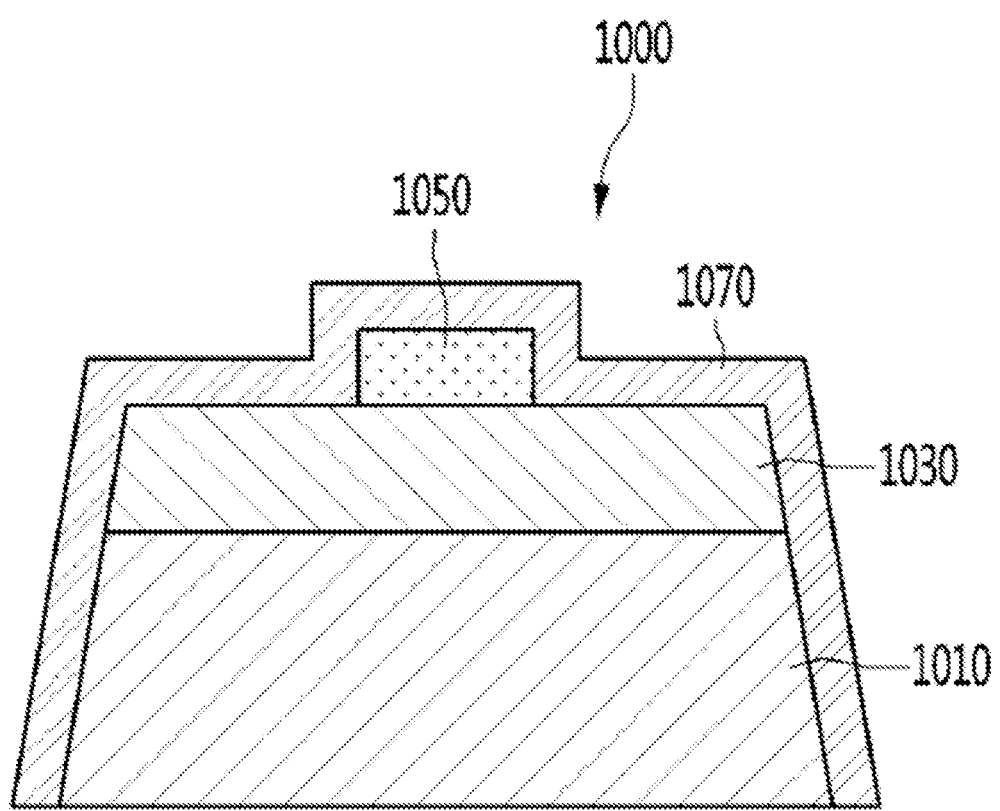
FIG. 2 is a diagram schematically illustrating a structure of a semiconductor light emitting device of FIG. 1.

FIG. 2 is a diagram schematically illustrating a structure of a semiconductor light emitting device of FIG. 1.

In following drawings, it is assumed that a semiconductor light emitting device 1000 is a horizontal semiconductor light emitting device. However, the embodiment of the present disclosure may not be limited to the horizontal semiconductor light emitting device, and may be similarly applied to a vertical semiconductor light emitting device.

In addition, in the following drawings, an upward direction of the semiconductor light emitting device 1000 may mean a direction toward a magnetic layer 1050, and a downward direction may mean a direction toward an n-type semiconductor layer 1010. In this case, light extracted from the semiconductor light emitting device 1000 may be emitted to the outside through an upper portion of the semiconductor light emitting device 1000.

Referring to FIG. 2, the semiconductor light emitting device 1000 may include the n-type semiconductor layer 1010, and a p-type semiconductor layer 1030 formed on top of the n-type semiconductor layer 1010. Each of the n-type semiconductor layer 1010 and the p-type semiconductor layer 1030 may contain gallium nitride (GaN) or gallium arsenide (GaAs) as a main material, and contain indium (In), aluminum (Al), and the like added thereto to emit light of various colors.

In one example, the semiconductor light emitting device 1000 may include the magnetic layer 1050 having a magnetic body. The magnetic layer 1050 may contain a magnetic metal such as nickel (Ni) and the like.

In FIG. 2, the magnetic layer 1050 is illustrated as being disposed on top of the p-type semiconductor layer 1030, but an arrangement position of the magnetic layer 1050 may be changed depending on a method for manufacturing the semiconductor light emitting device 1000.

A passivation layer 1070 may be formed to surround a top surface and side surfaces of the semiconductor light emitting device 1000. Because the passivation layer 1070 is formed in a state in which the semiconductor light emitting device 1000 is connected to a growth substrate (not shown), the passivation layer 1070 may not be formed on a bottom surface of the semiconductor light emitting device 1000.

As will be described later with reference to FIG. 3, the semiconductor light emitting device 1000 may be put into a fluid to be assembled onto a substrate. Because the semiconductor light emitting device 1000 put into the fluid includes the magnetic layer 1050, the semiconductor light emitting device 1000 may move to the substrate by a magnetic field and be assembled onto the substrate.

Figure 3:
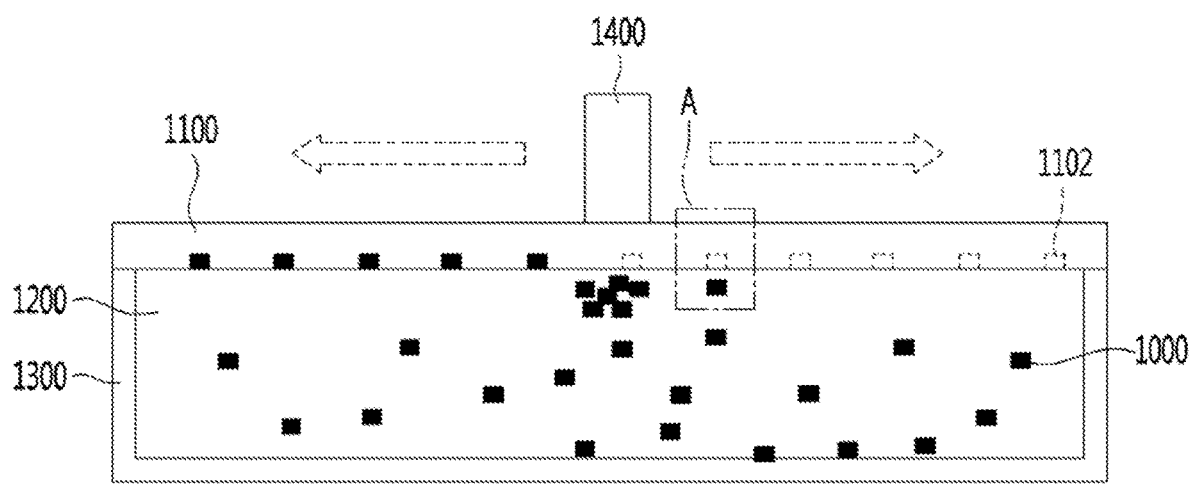
FIG. 3 is a diagram illustrating one embodiment of a method in which a semiconductor light emitting device having a structure shown in FIG. 2 is assembled onto a substrate by a self-assembly scheme.
Figure 4:
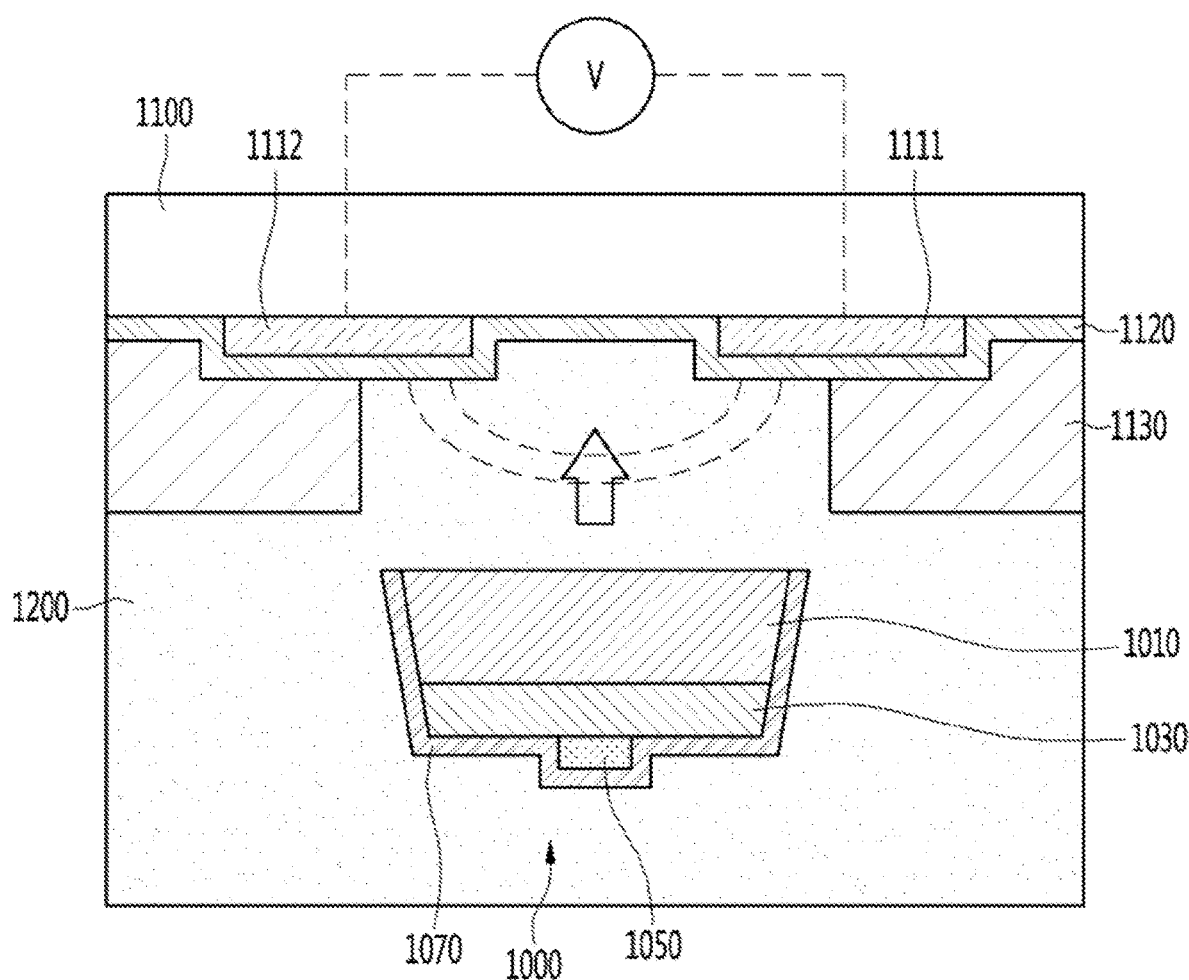
FIG. 4 is an enlarged view of a portion A of FIG. 3.

FIG. 3 is a diagram illustrating one embodiment of a method in which a semiconductor light emitting device having a structure shown in FIG. 2 is assembled onto a substrate by a self-assembly scheme. FIG. 4 is an enlarged view of a portion A of FIG. 3.

An example in which the semiconductor light emitting device is assembled onto the substrate by the self-assembly scheme using an electromagnetic field will be briefly described in FIGS. 3 to 4.

Referring to FIGS. 3 and 4, the semiconductor light emitting device 1000 may be put into a chamber 1300 filled with a fluid 1200.

Thereafter, a substrate 1100 may be disposed on top of the chamber 1300. According to the embodiment, the substrate 1100 may be put into the chamber 1300.

A pair of electrodes 1111 and 1112 corresponding to each of the semiconductor light emitting devices 1000 to be assembled may be formed on the substrate 1100. The electrodes 1111 and 1112 may be implemented as a transparent electrode (ITO) or may be implemented using other common materials. The electrodes 1111 and 1112 may correspond to a pair of assembly electrodes for fixing the assembled semiconductor light emitting device 1000 by emitting an electric field as a voltage is applied thereto. A gap between the electrodes 1111 and 1112 is smaller than a width of the semiconductor light emitting device 1000 and a width of a coupling hole 1102 to more precisely fix an assembly position of the semiconductor light emitting device 1000 using the electric field.

An insulating layer 1120 is formed on the electrodes 1111 and 1112 to protect the electrodes 1111 and 1112 from the fluid 1200 and to prevent leakage of current flowing through the electrodes 1111 and 1112. For example, the insulating layer 1120 may be formed of a single layer or multiple layers of an inorganic insulator such as silica, alumina, and the like or an organic insulator. The insulating layer 1120 may have a minimum thickness to prevent damage to the electrodes 1111 and 1112 when the semiconductor light emitting device 1000 is assembled, or may have a maximum thickness to stably assemble the semiconductor light emitting device 1000.

A partition wall 1130 may be formed on top of the insulating layer 1120. Partial regions of the partition wall 1130 may be positioned on top of the electrodes 1111 and 1112, and the remaining regions thereof may be positioned on top of the substrate 1100.

For example, when the substrate 1100 is manufactured, as a portion of the partition wall formed on top of the entire insulating layer 1120 is removed, the coupling hole 1102 in which each of the semiconductor light emitting devices 1000 is coupled and assembled to the substrate 1100 may be defined.

The coupling hole 1102 into which each of the semiconductor light emitting devices 1000 is coupled is defined in the substrate 1100, and a surface of the substrate 1100 in which the coupling hole 1102 is defined may be in contact with the fluid 1200.

The coupling hole 1102 may guide the correct assembly position of the semiconductor light emitting device 1000.

In one example, the coupling hole 1102 may have a shape and a size corresponding to those of the semiconductor light emitting device 1000 to be assembled at a corresponding position. Accordingly, it is possible to prevent assembly of another semiconductor light emitting device or a plurality of semiconductor light emitting devices into the coupling hole 1102.

After the substrate 1100 is disposed, an assembly apparatus 1400 including a magnetic body may move along the substrate 1100. The assembly apparatus 1400 may move while in contact with the substrate 1100 in order to maximize a region exerted by the magnetic field into the fluid 1200. According to the embodiment, the assembly apparatus 1400 may include a plurality of magnetic bodies, or a magnetic body having a size corresponding to that of the substrate 1100. In this case, a moving distance of the assembly apparatus 1400 may be limited within a predetermined range.

By the magnetic field generated by the assembly apparatus 1400, the semiconductor light emitting device 1000 in the chamber 1300 may move toward the assembly apparatus 1400.

The semiconductor light emitting device 1000 may come into contact with the substrate 1100 by entering the coupling hole 1102 while moving toward the assembly apparatus 1400. For example, a pattern, a shape, or the like for the n-type semiconductor layer 1010 of the semiconductor light emitting device 1000 to be in contact with the substrate 1100 may be formed in the coupling hole 1102 and/or the semiconductor light emitting device 1000.

In addition, by the electric field applied by the electrodes 1111 and 1112 formed on the substrate 1100, the semiconductor light emitting device 1000 in contact with the substrate 1100 may be prevented from being deviated by the movement of the assembly apparatus 1400.

That is, a time required for each of the semiconductor light emitting devices to be assembled onto the substrate may be drastically reduced by the self-assembly scheme using the electromagnetic field described above, so that a large-area, high-pixel display may be implemented more quickly and economically.

However, the self-assembly scheme requires an automatic visual inspection system for inspecting the coupling between the semiconductor light emitting device 1000 and the coupling hole 1102 because there is a case in which the semiconductor light emitting device 1000 is coupled to the coupling hole 1102 of another semiconductor light emitting device, in which the plurality of semiconductor light emitting devices 1000 are coupled to one coupling hole 1102, or in which the semiconductor light emitting device 1000 is deviated by the movement of the assembly apparatus.

Accordingly, the present disclosure provides automatic visual inspection system and method that may quickly and accurately inspect an assembly defect of the semiconductor light emitting device 1000 that is self-assembled in the fluid using a telecentric lens (TCL) and monochromatic lighting.

However, in addition to the self-assembly scheme of the semiconductor light emitting device 1000 described above, the automatic visual inspection system according to the present disclosure is applicable to other processes requiring precise and rapid inspection of an object in the fluid.

Figure 5:
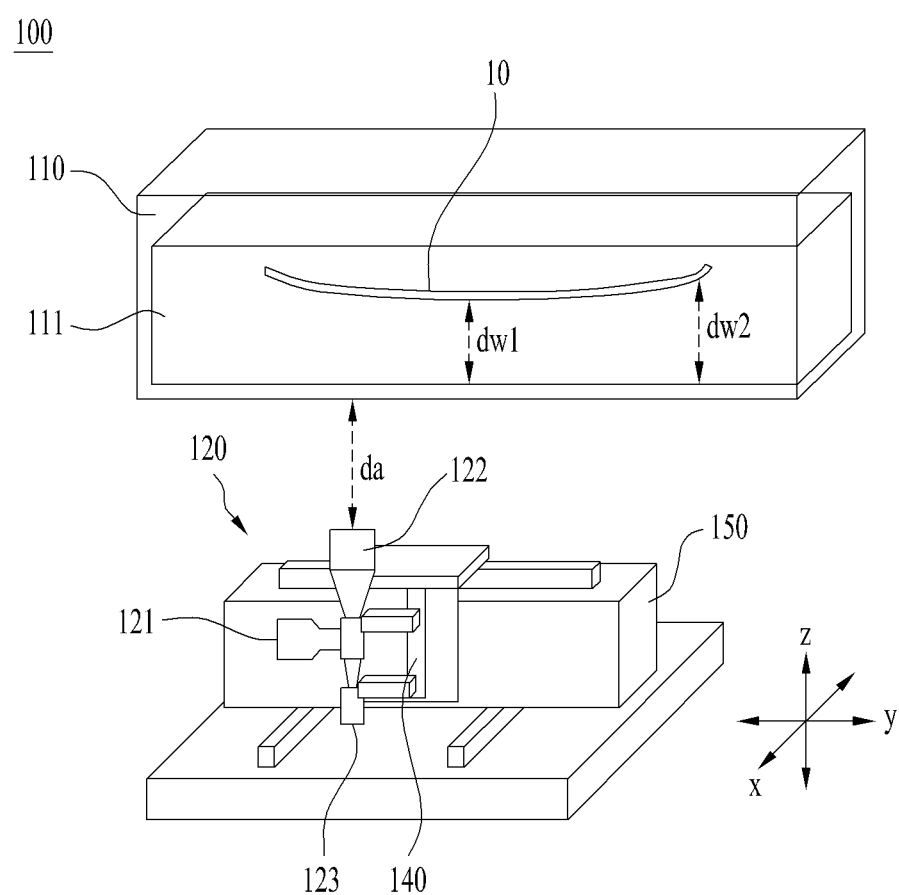
FIG. 5 is a diagram illustrating an automatic display pixel inspection system according to an embodiment of the present disclosure.

FIG. 5 is a diagram illustrating an automatic display pixel inspection system 100 according to an embodiment of the present disclosure.

Referring to FIG. 5, the automatic display pixel inspection system 100 according to the present disclosure is for inspecting an inspection object 10 in a fluid 111. For example, the inspection object 10 may be a substrate onto which the semiconductor light emitting device is self-assembled by the magnetic field in the fluid 111, and the automatic display pixel inspection system 100 may be for detecting the assembly defect of the semiconductor light emitting device.

When inspecting the inspection object 10 in the fluid 111, it is difficult to focus the object within a depth of focus or a depth of field of a lens by refractive indices of the fluid 111 and air, distance differences dw1 and dw2 resulted from deflection of the substrate and a wave of the fluid 111, an error da of apparatus control, chromatic aberration, and the like. Furthermore, when an image filming range is wide, even when a high-resolution lens and a camera 123 are used, a region exhibiting feature points of the inspection object 10 is recorded as low-resolution data in units of 1 to 10 pixels, which greatly reduces the accuracy of the inspection. In addition, even when ultra-high-resolution inspection equipment is used, when there are very many feature points for determining the defect of the inspection object 10 such as a display substrate, there is a problem that control of the inspection apparatus is difficult and an inspection speed is remarkably slow.

Therefore, the present disclosure uses the monochromatic lighting to film an inspection image within the fluid 111, utilizes the inspection image for each monochromatic light beam as it is, or acquire a color image synthesized from the inspection image for each monochromatic light beam.

However, when using the monochromatic light, a distance between the inspection object 10 and the lens or a distance between the lens and an image sensor (or the camera 123) varies based on a focal distance of each monochromatic light beam, and accordingly, a size of the acquired inspection image varies. Accordingly, the present disclosure acquires the inspection image for each monochromatic light beam using a telecentric lens 122 that moves along an optical axis direction in correspondence to the focal distance for each monochromatic light beam.

That is, the automatic display pixel inspection system 100 according to the present disclosure is a system for acquiring a high-contrast image using the telecentric lens 122 and the monochromatic light for the accurate and rapid inspection of the inspection object 10 in the fluid 111. However, a configuration of the present disclosure is not limited to the telecentric lens 122, and includes an optical system capable of acquiring an image of a certain size regardless of a distance between the lens and an object surface or a distance between the lens and a top surface.

Referring to FIG. 5, the automatic display pixel inspection system 100 according to the present disclosure includes a fluid tank 110, lighting 121, the telecentric lens 122, the camera 123, a driver 140, and a controller 150. When necessary, the automatic display pixel inspection system 100 may further include a storage (not shown) including a memory and the like for storing data for the inspection, and a display (not shown) for outputting the inspection image.

The fluid tank 110 may include an inner space for accommodating the fluid 111 therein, and an outer wall made of a transparent material through which the inspection object 10 in the fluid 111 may be inspected from the outside. In this connection, the outer wall may be an outer wall positioned on a top, bottom, or side surface of the fluid tank 110, and the inner space may be a dark room. Alternatively, the inspection object 10 in the fluid 111 may be freely observed from any direction as an entirety of the fluid tank 110 is made of the transparent material. For example, the fluid 111 may be distilled water or oil, and the fluid tank 110 may be made of a material such as glass, plastic, or the like.

The lighting 121 may irradiate at least one monochromatic light beam to the inspection object 10 in the fluid 111 to obtain a clear inspection image without the chromatic aberration. In this connection, the monochromatic light is a single color light with a constant wavelength. Specifically, the monochromatic light may have a color of red, green, or blue. For example, the red color may have a wavelength in a range from 610 to 700 nm, the green color may have a wavelength in a range from 500 to 570 nm, and the blue color may have a wavelength in a range from 450 to 500 nm. The lighting 121 may be coaxial lighting irradiated from the same axis as a central axis of the lens in order to obtain a stable contrast difference. Hereinafter, the contrast difference resulted from the monochromatic light irradiation will be described in detail in FIGS. 8 and 9.

The telecentric lens 122 is positioned outside the fluid tank 110 and collects the monochromatic light reflected from the inspection object 10. For example, the outside of the fluid tank 110 may be a portion below the fluid tank 110. In this connection, the telecentric lens 122 may be implemented as a telecentric optical system including at least one lens.

The telecentric optical system is an optical system in which one of an entrance pupil and an exit pupil is at infinity. The telecentric optical system may reduce an error in a size of an image being filmed even when there is an error in the object surface or the top surface, and may film an object at a long distance, so that the telecentric optical system may be used for a contour projector, a dimensioning machine of the object, or the like.

For example, the telecentric lens 122 may be a lens system that acquires the image of the certain size regardless of the distance from the inspection object 10 by selecting a monochromatic light beam incident parallel to an optical axis of the optical system from the inspection object 10 and transmitting the selected beam to the camera 123. As another example, the telecentric lens 122 may be a lens system that includes at least one lens to acquire the image of the certain size even when the object surface or the top surface moves in the optical axis direction within the depth of field.

The driver 140 moves the telecentric lens 122 in at least one direction. In this connection, the at least one direction includes at least one of the optical axis direction of the telecentric lens 122, a first axis direction perpendicular to the optical axis, and a second axis direction perpendicular to the first axis. In this connection, the optical axis direction may be perpendicular to the bottom surface of the fluid tank 110. The driver 140 may include a motor for moving the telecentric lens 122 linearly along the at least one direction.

The driver 140 may be connected to the telecentric lens 122 or the camera 123 coupled to the telecentric lens 122 to move the telecentric lens 122. In this connection, the driver 140 may move only the telecentric lens 122 or an entire filming assembly 120 including the telecentric lens 122 and the camera 123 and the lighting 121 coupled to the telecentric lens 122. For example, the driver 140 may be implemented as a moving stage that is subjected to 3-axis control by a universal machine and automation controller (UMAC) or a programmable logic controller (PLC).

The camera 123 acquires the inspection image by receiving the monochromatic light that has passed through the telecentric lens 122. In this connection, the camera 123 includes the image sensor that receives the monochromatic light and converts the light into an electrical signal.

The camera 123 may form the filming assembly 120 integrally with the telecentric lens 122 to move in a direction the same as that of the telecentric lens 122 on the optical axis. Alternatively, the camera 123 may be separated from the telecentric lens 122 and fixed on the optical axis by the driver 140, or may move in a direction different from that of the telecentric lens 122.

The controller 150 controls at least one of the lighting 121, the telecentric lens 122, the driver 140, and the camera 123. The controller 150 may include the universal machine and automation controller (UMAC) or the programmable logic controller (PLC) for controlling the moving stage. In addition, the controller 150 may include an application processor (AP), a central processing unit (CPU), a graphics processing unit (GPU), an application specific integrated circuit (ASIC), or the like capable of processing the image obtained from the camera 123.

The controller 150 may control the driver 140 to adjust the distance between the inspection object 10 and the telecentric lens 122 in response to a wavelength of monochromatic light. In this connection, the distance may be a distance corresponding to a focal distance between the telecentric lens 122 and the inspection object 10. For example, the controller 150 may adjust the distance between the inspection object 10 and the telecentric lens 122 in response to a depth of field of the telecentric lens 122 based on a wavelength of a specific monochromatic light beam. Alternatively, the controller 150 may adjust the distance between the telecentric lens 122 and the image sensor (or the camera 123) in response to the depth of focus of the telecentric lens 122 based on the wavelength of the specific monochromatic light beam.

The controller 150 may control the lighting 121 to sequentially irradiate a plurality of monochromatic light beams having different wavelength bands to the inspection object 10 based on a predetermined period. In this connection, the controller 150 may control the lighting 121 to sequentially irradiate the plurality of monochromatic light beams in an order of a magnitude of an average value of the wavelength band. Furthermore, the controller 150 may control the driver 140 to move the telecentric lens 122 to an uninspected region after the plurality of monochromatic lights are sequentially irradiated.

The controller 150 may control the driver 140 by calculating at least one of the focal distance of each monochromatic light beam, the depth of focus, and the depth of field. For example, the controller 150 may analyze the inspection image acquired from the camera 123 through an image processing algorithm to determine whether the image is in focus. In this connection, the controller 150 may quantify whether the image is in focus to control the driver 140 such that the lens is positioned at a point where the highest score is obtained.

The controller 150 may control the camera 123 to acquire the inspection image. In this connection, the controller 150 may separately store each inspection image corresponding to each monochromatic light beam in a storage medium such as the memory and the like. In addition, the controller 150 may convert the stored inspection image for each monochromatic light beam of one channel into one color image having three channels.

The controller 150 may detect the defect of the inspection object 10 by analyzing the inspection image. For example, when there is a contrast difference in brightness or chroma of a degree equal to or greater than a certain degree when comparing a specific region in the inspection image with a surrounding region, the controller 150 may recognize a specific portion as defective. Furthermore, when there is the defect in the inspection object 10, the controller 150 may warn of the defect through an external device connected to the controller 150.

Hereinafter, operations of the controller 150 will be described in detail with reference to FIGS. 6 to 11.

Figure 6:
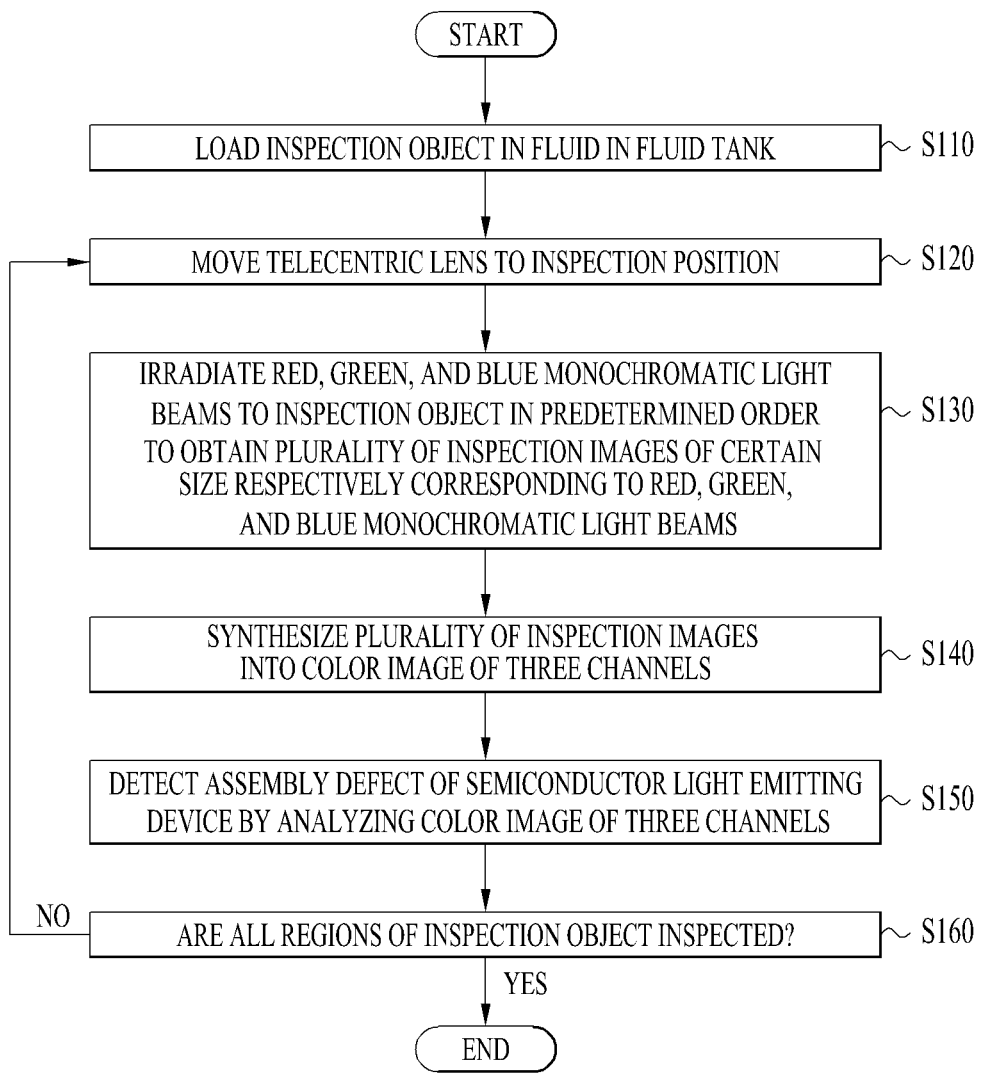
FIGS. 6 to 8 are diagrams illustrating an automatic display pixel inspection method according to an embodiment of the present disclosure.
Figure 7:
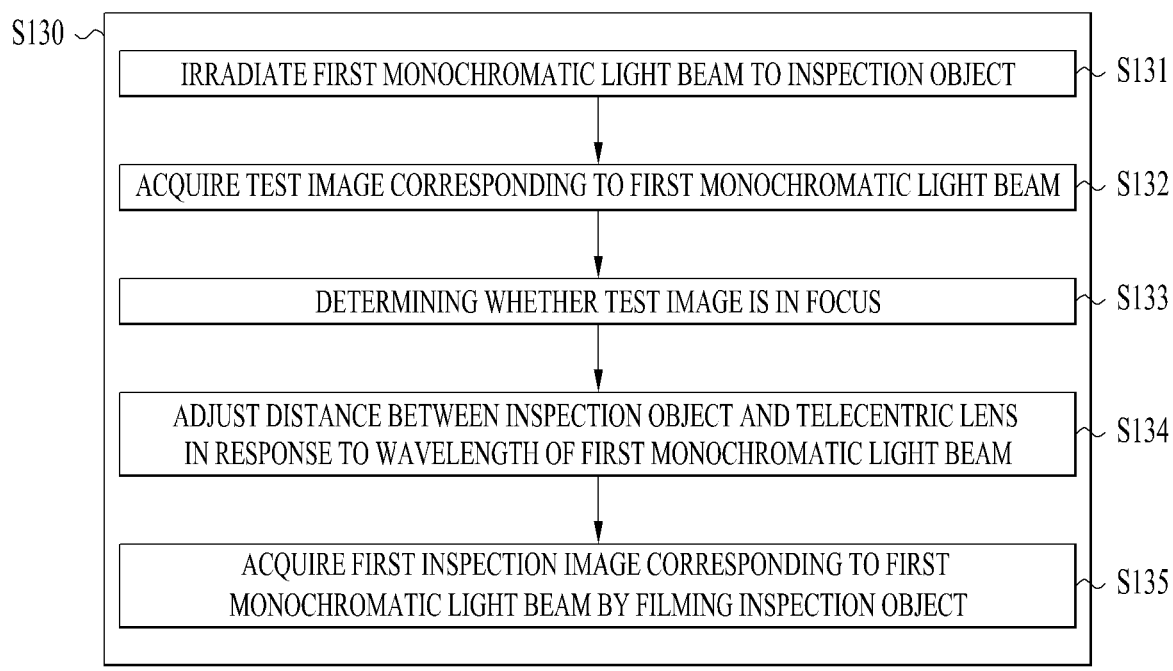
Figure 8:
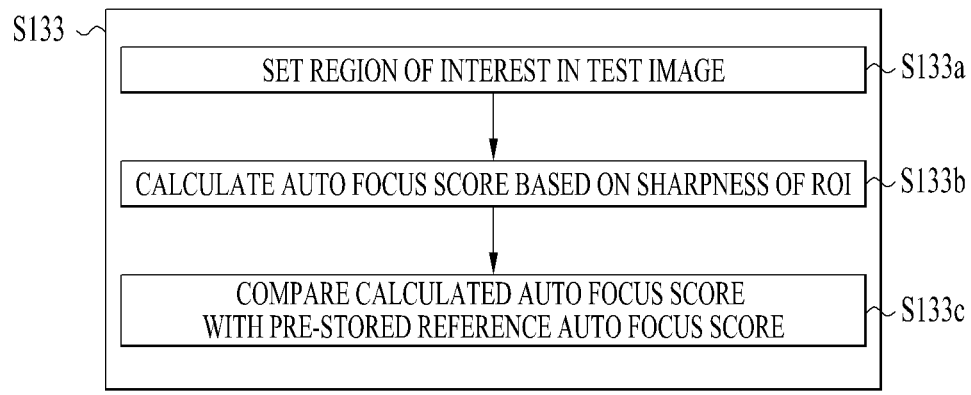

FIGS. 6 to 8 are diagrams illustrating an automatic display pixel inspection method according to an embodiment of the present disclosure. A following inspection method is performed by the controller 150.

FIG. 6 is a diagram illustrating an overall flow of the automatic display pixel inspection method. FIG. 7 is a diagram illustrating a method for acquiring the plurality of inspection images. FIG. 8 is a diagram illustrating a method for synthesizing the plurality of inspection images into the color image of the three channels.

Referring to FIG. 6, the inspection object 10 is loaded in the fluid tank 110 (S110).

The telecentric lens 122 is moved to an inspection position (S120). Specifically, a program for driving the motor of the driver 140 that moves the telecentric lens 122, the lighting 121, and the camera 123 may be executed.

The red, the green, and the blue monochromatic light beams are irradiated to the inspection object 10 in the predetermined order to acquire the plurality of inspection images of the certain size respectively corresponding to the red, the green, and the blue monochromatic light beams (S130). In this connection, the controller 150 may control the driver 140 to move the telecentric lens 122 on the optical axis to obtain an inspection image determined to be in focus. Hereinafter, the inspection image acquisition method will be described in detail with reference to FIGS. 7 and 8.

The monochromatic light beams may be sequentially irradiated to the inspection object 10 based on the predetermined period. In this connection, the plurality of monochromatic light beams may be irradiated to the inspection object 10 in the order of the magnitude of the average value of the wavelength band. For example, the red beam may be irradiated after 30 ms, the green beam may be irradiated after 60 ms, and the blue beam may be irradiated after 1 ms from a reference time point, at a period of 90 ms.

The plurality of inspection images are synthesized into the color image of the three channels (S140). In this connection, the controller 150 may process the plurality of inspection images and synthesize the images into the color image. For example, based on a pre-stored look-up table, the controller 150 may synthesize the plurality of inspection images into the color image by adjusting an intensity value of each inspection image corresponding to each of the red, green, and blue monochromatic light beams.

The assembly defect of the semiconductor light emitting device is detected by analyzing the color image of the three channels (S150). For example, the controller 150 may detect the assembly defect based on a feature that is well detected for each monochromatic light beam through three-channel analysis. As another example, the controller 150 may detect the assembly defect by identifying a feature that is not well detected in the inspection image acquired using only the monochromatic light based on the synthesized color image. Hereinafter, the detection of the assembly defect based on the monochromatic light or white light will be described in detail in FIGS. 9 and 10.

Referring to FIG. 7, the acquiring of the plurality of inspection images (S130) may further include following operations.

First monochromatic light is irradiated to the inspection object 10 (S131). In this connection, the first monochromatic light may have a color of red, green, and red.

A test image corresponding to the first monochromatic light is acquired (S132). In this connection, the test image refers to an image filmed at an arbitrary point on a moving axis of the telecentric lens 122 to obtain the focused inspection image.

Whether the test image is in focus is determined (S133). Hereinafter, the determining of whether the test image is in focus based on an auto focusing score will be described in detail with reference to FIG. 8.

When it is determined that the test image is not in focus, the distance between the inspection object 10 and the telecentric lens 122 is adjusted in response to a wavelength of the first monochromatic light (S134). In this connection, the distance may be a distance corresponding to the depth of field of the telecentric lens 122 based on the wavelength of the first monochromatic light.

A first inspection image corresponding to the first monochromatic light is acquired by filming the inspection object 10 (S135).

Referring to FIG. 8, the determining whether the test image is in focus (S133) may further include following operations.

A region of interest in the test image is set (S133a).

An auto focus score is calculated based on sharpness of the ROI (S133b).

The calculated auto focus score is compared with a pre-stored reference auto focus score (S133b).

Referring to FIGS. 7 and 8, the controller 150 may control the driver 140 based on the auto focus score calculated as the telecentric lens 122 moves in a first direction. For example, when the auto focus score increases, the controller 150 may control the driver 140 to maintain the movement in the first direction. Alternatively, when the auto focus score decreases, the controller 150 may control the driver 140 to move the telecentric lens 122 in a second direction opposite to the first direction. Furthermore, when the auto focus score increases and then decreases again while the telecentric lens 122 is moving in a specific direction, the driver 140 may be controlled such that the telecentric lens 122 is positioned at a position where the highest auto focus score is obtained. As another example, the controller 150 may control the driver 140 such that n test images for respective predetermined moving distances of the telecentric lens 122 may be acquired and the telecentric lens 122 is positioned at a position corresponding to a test image with the highest auto focus score.

Figure 9:
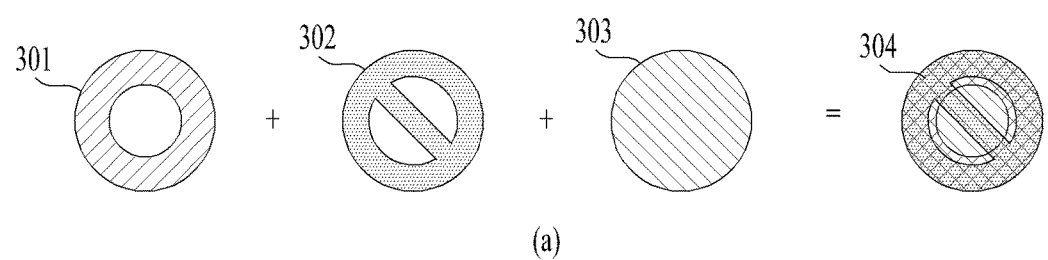
FIG. 9 is a diagram conceptually illustrating an inspection image and a color image for each monochromatic light beam obtained when a general lens or a telecentric lens is used.
Figure 9:
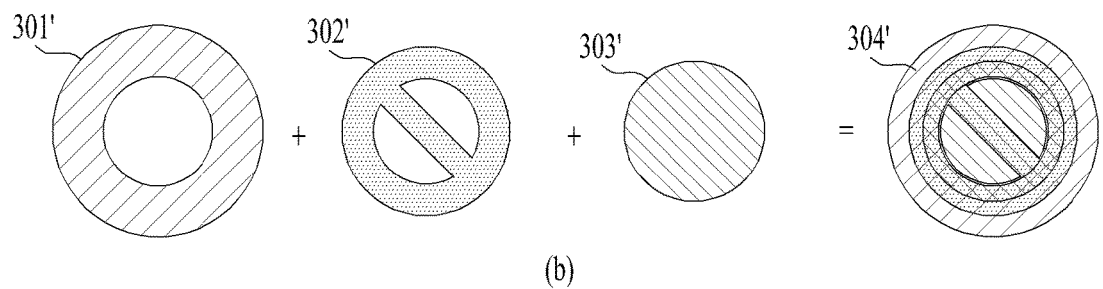

FIG. 9 is a diagram conceptually illustrating an inspection image and a color image for each monochromatic light obtained when a general lens or the telecentric lens 123 is used.

(a) in FIG. 9 is a view showing inspection images 301, 302, and 303 for the respective monochromatic light beams, and a color image 304 obtained when the telecentric lens 123 is used. (b) in FIG. 9 is a view showing inspection images 301', 302', and 303' for the respective monochromatic light beams, and a color images 304' obtained when the general lens is used.

Referring to (a) and (b) in FIG. 9, the controller 150 may store the set of images 301, 302, and 303 and the set of images 301', 302', and 303' corresponding to the respective red, green, and blue monochromatic light beams. In this connection, the image may be an 8-bit gray scale image.

The controller 150 may synthesize the set of images 301, 302, and 303 and the set of images 301', 302', and 303' corresponding to the respective red, green, and blue monochromatic light beams to obtain the color images 304 and 304', respectively. In this connection, the color images 304 and 304' may be the color images of the three channels corresponding to the red, the green, and the blue, respectively.

Referring to (a) in FIG. 9, the controller 150 may acquire the images 301, 302, and 303 respectively corresponding to the red, green, and blue monochromatic light beams with a certain size based on a characteristic of the telecentric lens 123 of obtaining the image of the certain size independently of the focal distance within the depth of field. Therefore, the controller 150 may quickly synthesize the images without a separate image size change. In addition, because the images 301, 302, and 303 have the same size, by applying the same algorithm to the images 301, 302, and 303 and processing the images at once, the controller 150 may simplify an inspection process and obtain an accurate inspection result. In order to obtain images of a more uniform size, the telecentric lens 123 may be implemented as a system of double telecentric lenses 123.

The controller 150 may detect the defect of the inspection object 10 based on one of the images 301, 302, and 303 respectively corresponding to the red, green, and blue monochromatic light beams. In this connection, the controller 150 may detect different defects depending on the wavelength of the monochromatic light. For example, the controller 150 may detect a foreign object recognized with high sharpness only through the red monochromatic light beam based on one inspection image acquired using the red monochromatic light beam. In this connection, the detection of the foreign object recognized with the high sharpness only through the specific monochromatic light beam may be performed before the synthesis of the color image 304. Alternatively, the controller 150 may analyze each channel of the synthesized color image 304 to detect the foreign object recognized with the high sharpness only through the specific monochromatic light beam.

The controller 150 may detect the defect of the inspection object 10 by synthesizing the images 301, 302, and 303 respectively corresponding to the red, green, and blue monochromatic light beams. This is to detect a defect that is not properly identified or detected when only the monochromatic light is used. In addition, it is possible to detect more various types of defects based on at least three times as much information compared to the case of using only the monochromatic light. That is, the automatic display pixel inspection system 100 according to the present disclosure may accurately detect the various types of defects using both the inspection images 301, 302, and 303 acquired through the monochromatic light and the color image 304 synthesized from the inspection images 301, 302, and 303. Hereinafter, the types of defects detected will be described in detail in FIG. 11.

Referring to (b) in FIG. 9, the telecentric lens 123 may be replaced with the general lens. The controller 150 may acquire the images 301', 302', and 303' respectively corresponding to the red, green, and blue monochromatic light beams. When using the general lens, as the distance between the lens and the inspection object 10 is adjusted to ensure the focal distance within the depth of field corresponding to each monochromatic light beam, magnification of the acquired image is changed. Accordingly, the controller 150 acquires images of different sizes. When the images 301', 302', and 303' are synthesized as the color image 304' as it is, it is difficult to obtain a clear image. Accordingly, the controller 150 may detect the defect by applying different algorithms to the images without synthesizing the images 301', 302', and 303', or may detect the defect by synthesizing the images after converting the sizes thereof. However, compared to the case of using the telecentric lens 123, the inspection is complicated, the accuracy of the inspection is low, and information is lost in the conversion process. Hereinafter, contrast differences in the case in which the white light is used and the case in which the monochromatic light is used will be described in detail in FIG. 10.

Figure 10:
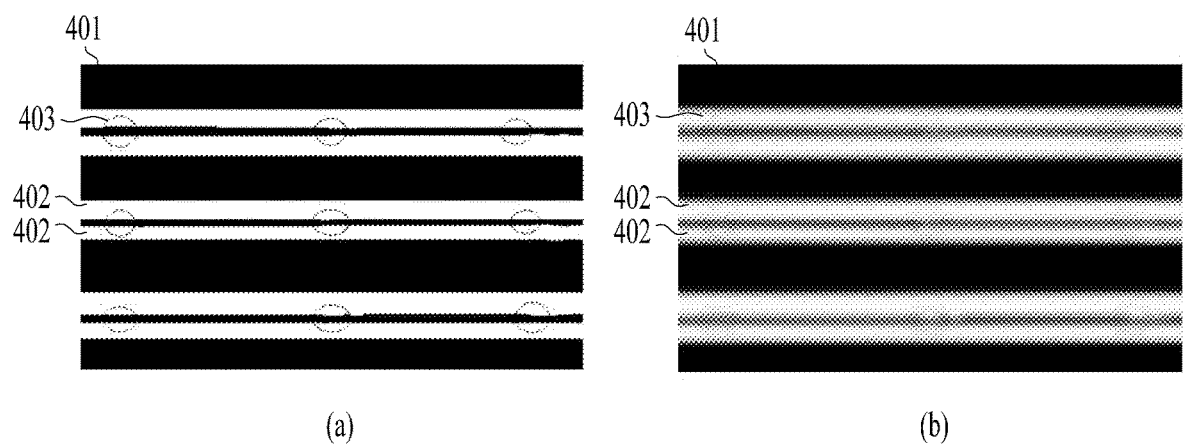
FIG. 10 is a diagram illustrating a contrast difference between a color image and an inspection image of a substrate obtained using white light, according to an embodiment of the present disclosure.

FIG. 10 is a diagram illustrating a contrast difference between a color image and an inspection image of a substrate obtained using white light, according to an embodiment of the present disclosure. In this connection, the contrast difference includes the sharpness of the image.

(a) in FIG. 10 is a diagram showing a color image obtained by synthesizing inspection images of the substrate obtained according to an embodiment of the present disclosure. (b) in FIG. 10 is an inspection image of the substrate obtained using the white light.

Referring to (a) in FIG. 10, as described above, the controller 150 may acquire the color image by synthesizing the inspection images of the certain size respectively corresponding to the red, green, and blue monochromatic light beams. As shown in (a) in FIG. 10, the controller 150 may acquire a color image in which an assembly electrode 402 or a coupling hole 403 formed on and defined in a substrate 401 is identifiable. That is, the display pixel inspection system according to the present disclosure may accurately inspect a fine-sized inspection object through a clear color image without blurring resulted from the chromatic aberration or the image size difference. In one example, even when using the monochromatic light, when the focus based on the wavelength of the monochromatic light is located within the depth of field, the coupling hole 403 and the like may be identifiable. However, a defect that is not well detected at a specific wavelength is missed or it is difficult to accurately determine the type of the defect.

Referring to (b) in FIG. 10, when using the general white light, unlike the case of (a) in FIG. 10, it is difficult to obtain a high-contrast inspection image due to the chromatic aberration. Accordingly, the assembly electrode 402 and the coupling hole 403 of the substrate 401 are not properly identified. In addition, even when the monochromatic light is used, when synthesizing inspection images with different magnifications, it is difficult to obtain the high-contrast inspection images as in the case of using the white light.

That is, the automatic display pixel inspection system 100 according to the present disclosure may film a larger inspection region with the same equipment by acquiring an image having an improved contrast difference or sharpness. Accordingly, the number of images required for one inspection object 10 and a movement path of the filming assembly 120 including the lens 122 and the camera 123 are reduced, thereby enabling the rapid inspection. For example, when it is possible to obtain an image with a 4 times area by lowering the magnification of the lens, the inspection speed will be improved by about 4 times.

Figure 11:
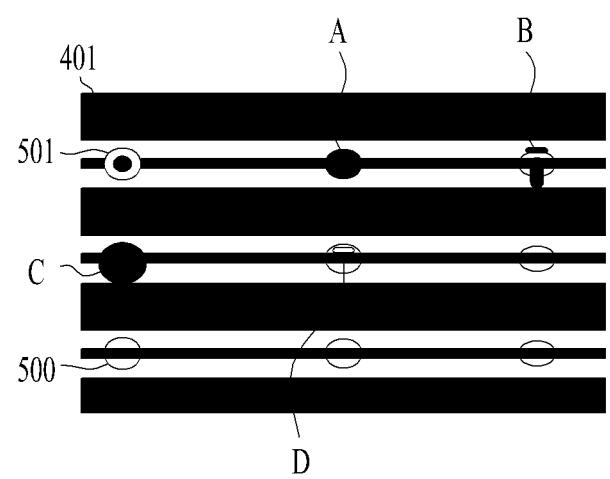
FIG. 11 is a diagram illustrating a defect detectable by an automatic display pixel inspection system according to an embodiment of the present disclosure.

FIG. 11 is a diagram illustrating a defect detectable by an automatic display pixel inspection system according to an embodiment of the present disclosure.

Referring to FIG. 11, the controller 150 may detect an assembly defect of a semiconductor light emitting device 501 that is self-assembled by the magnetic field in the fluid. In this connection, the assembly defect may include at least one of a case in which the semiconductor light emitting device 501 is coupled in a flipped or oblique manner (A), a case in which the plurality of semiconductor light emitting devices 501 are coupled to one coupling hole 500 (B), a case in which bubbles are formed in the coupling hole 500 (C), and a case in which a substrate surface is peeled off (D).

As shown in FIG. 11, it is difficult to accurately detect the type of assembly defect only with the image acquired using the single monochromatic light beam. For example, it is difficult to accurately identify whether the semiconductor light emitting device 501 is coupled to the coupling hole in the flipped or oblique manner only with the image acquired using the single monochromatic light beam. For another example, it is difficult to accurately identify whether the plurality of semiconductor light emitting devices 501 are coupled to one coupling hole or whether the bubbles are formed in the coupling hole into which the semiconductor light emitting device 501 is coupled only with the image acquired using the single monochromatic light beam. Therefore, the automatic display pixel inspection system 100 according to the present disclosure may accurately detect the various types of assembly defects by acquiring the color image by synthesizing the inspection images respectively corresponding to the red, green, and blue monochromatic light beams. In addition, when it is difficult to perform the inspection with only an inspection algorithm, the controller 150 may control the display to output the color image on a display screen, so that the defect may be detected more accurately by visually identifying, by a user, the color image that is familiar.

According to one embodiment of the present disclosure, the present disclosure may obtain the clear inspection image by minimizing the chromatic aberration using the monochromatic light.

According to another embodiment of the present disclosure, the present disclosure may efficiently correct the chromatic aberration at the low cost by automatically controlling the distance between the inspection object and the lens based on the wavelength of the monochromatic light.

According to another embodiment of the present disclosure, the present disclosure may be flexibly applicable to the various inspection environments.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

The invention claimed is:

1. A system for detecting an assembly defect of a semiconductor light emitting device, the system comprising:
   a tank including an outer wall comprising a transparent material to allow inspection of an object located in a fluid inside the tank from outside the tank;
   a lighting device configured to irradiate the object;
   a telecentric lens located outside the tank and configured to condense light reflected from the irradiated object;
   a driver configured to move the telecentric lens along an optical axis of the telecentric lens;
   a controller configured to control the lighting device to sequentially irradiate the object with a red monochromatic light beam, a green monochromatic light beam, and a blue monochromatic light beam in order of respective wavelengths of the red, green and blue monochromatic light beams, based on a predetermined period relative to a predetermined time point, and control the driver to sequentially move the telecentric lens to adjust a distance between the object and the telecentric lens in response to the respective wavelengths of the red, green and blue monochromatic light beams; and
   a camera configured to receive the reflected light that has passed through the telecentric lens to acquire a plurality of images of a certain size corresponding to the red, green, and blue monochromatic light beams, respectively,
   wherein the controller is further configured to detect the assembly defect of the semiconductor light emitting device by synthesizing the plurality of images into a color image of three channels.

2. The system of claim 1, wherein the controller is further configured to acquire and store each of the plurality of images as a gray scale image.

3. The system of claim 2, wherein the controller is further configured to adjust an intensity of each image based on a pre-stored look-up table and synthesize the plurality of images into the color image.

4. The system of claim 1, wherein the semiconductor light emitting device is a light emitting diode (LED) or micro-LED having a size of a micrometer.

5. The system of claim 1, wherein the semiconductor light emitting device is self-assembled onto a substrate.

6. A method for detecting an assembly defect of a semiconductor light emitting device, the method comprising:
   disposing an object in a fluid inside a tank;
   disposing a telecentric lens at an inspection position outside the tank;
   sequentially irradiating the object with a red monochromatic light beam, a green monochromatic light beam, and a blue monochromatic light beam in order of respective wavelengths of the red, green and blue monochromatic light beams, based on a predetermined period relative to a predetermined time point, to obtain a plurality of images of a certain size respectively corresponding to the red, green, and blue monochromatic light beams;
   synthesizing the plurality of images into a color image of three channels; and
   detecting the assembly defect of the semiconductor light emitting device by analyzing the color image of the three channels,
   wherein irradiating the object includes sequentially controlling the telecentric lens to move to adjust a distance between the object and the telecentric lens in response to the respective wavelengths of the red, green and blue monochromatic light beams.

7. The method of claim 6, wherein irradiating the object further includes:
   irradiating the object with a first monochromatic light beam of the red monochromatic light beam, the green monochromatic light beam, or the blue monochromatic light beam;
   acquiring a test image corresponding to the first monochromatic light beam;
   determining whether the test image is in focus;
   adjusting the distance between the object and the telecentric lens in response to the wavelength of the first monochromatic light beam based on determining that the test image is not in focus; and
   acquiring a first image corresponding to the first monochromatic light beam by filming the object.

8. The method of claim 7, wherein determining whether the test image is in focus includes:
   setting a region of interest in the test image;
   calculating an auto focus score based on a sharpness of the region of interest; and
   comparing the calculated auto focus score with a pre-stored reference auto focus score.

9. The method of claim 6, wherein synthesizing the plurality of images into the color image includes:
   acquiring and storing each of the plurality of images as a gray scale image; and
   synthesizing the plurality of images into the color image by adjusting an intensity of each image based on a pre-stored look-up table.

10. The method of claim 6, wherein the semiconductor light emitting device is a light emitting diode (LED) or micro-LED having a size of a micrometer.

11. The method of claim 6, wherein the semiconductor light emitting device is self-assembled onto a substrate.

* * * * *